United States Patent
Ravi

(10) Patent No.: US 9,257,284 B2
(45) Date of Patent: Feb. 9, 2016

(54) SILICON HETEROJUNCTION SOLAR CELLS

(71) Applicant: Crystal Solar, Incorporated, Santa Clara, CA (US)

(72) Inventor: Kramadhati V. Ravi, Atherton, CA (US)

(73) Assignee: Crystal Solar, Incorporated, Santa Clara, CA (US)

( * ) Notice: Subject to any disclaimer, the term of this patent is extended or adjusted under 35 U.S.C. 154(b) by 317 days.

(21) Appl. No.: 13/740,980

(22) Filed: Jan. 14, 2013

(65) Prior Publication Data

US 2013/0180578 A1 Jul. 18, 2013

Related U.S. Application Data

(60) Provisional application No. 61/586,701, filed on Jan. 13, 2012, provisional application No. 61/656,957, filed on Jun. 7, 2012.

(51) Int. Cl.
*H01L 21/00* (2006.01)
*H01L 29/66* (2006.01)
(Continued)

(52) U.S. Cl.
CPC ........ *H01L 21/2033* (2013.01); *H01L 21/3147* (2013.01); *H01L 31/022425* (2013.01); *H01L 31/056* (2014.12); *H01L 31/0747* (2013.01);
(Continued)

(58) Field of Classification Search
CPC .......................... H01L 21/2033; H01L 21/3147
USPC .............. 438/41, 44, 350, 973; 257/592, 929
See application file for complete search history.

(56) References Cited

U.S. PATENT DOCUMENTS 6,190,937 B1 * 2/2001 Nakagawa ............... C30B 19/12
257/E21.115
8,809,097 B1  8/2014 Ravi et al.
(Continued)

FOREIGN PATENT DOCUMENTS

JP   05-003338    1/1993
JP   2011-003639  1/2011
(Continued)

OTHER PUBLICATIONS

Search Report issued Jan. 14, 2013 in corresponding PCT/US2013/021439.
(Continued)

*Primary Examiner* — Calvin Lee
(74) *Attorney, Agent, or Firm* — David H. Jaffer; Pillsbury Winthrop Shaw Pittman LLP

(57) ABSTRACT

Methods are described for fabricating HIT solar cells, including double heterojunction and hybrid heterojunction-homojunction solar cells, with very thin single crystal silicon wafers, where the silicon wafer may be less than 80 microns thick, and even less than 50 microns thick. The methods overcome potential issues with handling these very thin wafers by using a process including epitaxial silicon deposition on a growth substrate, partial cell fabrication, attachment to a support substrate and then separation from the growth substrate. Some embodiments of the present invention may include a solar cell device architecture comprising the combination of a heterostructure on the front side of the device with a homojunction at the rear of the device. Furthermore, device performance may be enhanced by including a dielectric stack on the backside of the device for reflecting long wavelength infrared radiation.

18 Claims, 7 Drawing Sheets

(51) Int. Cl.
*H01L 21/203* (2006.01)
*H01L 31/20* (2006.01)
*H01L 21/314* (2006.01)
*H01L 31/0224* (2006.01)
*H01L 31/0747* (2012.01)
*H01L 31/18* (2006.01)
*H01L 31/056* (2014.01)
*H01L 33/22* (2010.01)

(52) U.S. Cl.
CPC .......... *H01L 31/1892* (2013.01); *H01L 31/202* (2013.01); *H01L 33/22* (2013.01); *Y02E 10/52* (2013.01)

(56) References Cited

U.S. PATENT DOCUMENTS

| | | |
|---|---|---|
| 2009/0227063 A1 | 9/2009 | Ravi et al. |
| 2010/0108130 A1 | 5/2010 | Ravi |
| 2010/0108134 A1 | 5/2010 | Ravi |
| 2011/0056532 A1 | 3/2011 | Ravi |
| 2011/0265866 A1 | 11/2011 | Oh et al. |
| 2012/0040487 A1 | 2/2012 | Asthana et al. |
| 2013/0032084 A1 | 2/2013 | Sivaramakrishnan et al. |
| 2013/0056044 A1 | 3/2013 | Ravi |

FOREIGN PATENT DOCUMENTS

| | | |
|---|---|---|
| JP | 2011-054837 | 3/2011 |
| KR | 10-2011-0128155 | 11/2011 |

OTHER PUBLICATIONS

Maki, K., et al., "High-Efficiency HIT Solar Cells with a Very Thin Structure Enabling a High Voc", 37th IEEE PV Specialists Conf., (2011), pp. 1-5.

Taguchi, et al., "Improvement of the Conversion Efficiency of Polycrystalline Silicon Thin Film Solar Cell," Proc. $5^{th}$ Photovoltaic Science and Engineering Conf, (1990), pp. 689-692.

Taguchi, et al, "High Efficiency Hit 'Solar Cell on Thin (<100um) Silicon Wafer", Proc. $24^{th}$ EU PVSEC, Hamburg, Germany, (2009), 4 pages.

* cited by examiner

SILICON HETEROJUNCTION SOLAR CELLS

CROSS-REFERENCE TO RELATED APPLICATIONS

This application claims the benefit of U.S. Provisional Application No. 61/586,701 filed Jan. 13, 2012, and U.S. Provisional Application No. 61/656,957 filed Jun. 7, 2012, both incorporated herein by reference in their entirety.

FIELD OF THE INVENTION

The present invention relates generally to solar cells, and more particularly to silicon heterojunction solar cells with high efficiency.

BACKGROUND

The fabrication of a Heterojunction with Intrinsic Thin-layer (HIT) device, including a thin (~10 nm) amorphous silicon film on a single crystal substrate, has been shown to enable solar cells with high open circuit voltages, as a result of the larger band offset achieved between the wider band gap amorphous silicon and the single crystal silicon as well as the superior surface passivation characteristics of amorphous silicon. (M. Taguchi et al., Proceedings 5th Photovoltaic Science and Engineering Conference (1990) 689). Recent research at Sanyo has shown that reducing wafer thickness with HIT devices has the effect of increasing the open circuit voltage but with a reduction of the short circuit current due to loss of long wavelength infrared radiation as the wafer gets thinner. See FIG. 1, showing data from Taguchi et al. "High efficiency HIT solar cell on thin (<100 micron) silicon wafer" $24^{th}$ EU PVSEC (2009). The plot in FIG. 1 shows values for short circuit current density, $I_{sc}$, open circuit voltage, $V_{oc}$, and efficiency, Eff, for two thicknesses of thin cells, where the values are given relative to those for a 165 micron thick cell. Sanyo's data is for wafer thicknesses down to about 75 microns. However, the latest data from Sanyo ($37^{th}$ IEEE PV specialists conference, 2011) has shown record open circuit values as high as 747 mV for a 58 micron thick wafer (where the wafer was mechanically thinned).

However, the fabrication by mechanical thinning and handling of these very thin wafers poses problems for manufacturing and is not economically viable—there is a need for improved methods of fabricating and handling thin silicon in the production of HIT solar cells.

Furthermore, as silicon wafer thickness is reduced to reduce silicon consumption and hence manufacturing costs of photovoltaic products, more of the long wavelength infrared radiation will pass through the thin wafer without being absorbed, due to the relatively poor absorption coefficient of silicon. Consequently cell efficiency is reduced for thin (less than roughly 50 micron) silicon cells. There is a need for solar cell structures which can compensate for the poor absorption of longer wavelength light.

Yet furthermore, even though the conversion efficiency of the conventional prior art HIT cells is roughly 23%, it is far from what may theoretically be achieved—there is still a need for improved cell efficiency.

SUMMARY OF THE INVENTION

The present invention includes manufacturable methods for fabricating HIT solar cells, including double heterojunction solar cells and hybrid heterojunction-homojunction solar cells, with very thin single crystal silicon wafers, where the silicon wafer may be less than 80 microns thick, and even less than 50 microns thick. The methods overcome potential issues with handling these very thin wafers by using a process including epitaxial silicon deposition on a growth substrate, partial cell fabrication, attachment to a support substrate and then separation from the growth substrate.

Furthermore, the present invention includes device structures based on the HIT solar cell which are expected to provide cost of manufacturing and performance advantages. For example, embodiments of the present invention may include a solar cell device architecture comprising the combination of a heterostructure on the front side of the device with a homojunction at the rear of the device. Furthermore, device performance may be enhanced by including a dielectric stack on the backside of the device for reflecting long wavelength infrared radiation.

According to aspects of the present invention, a silicon heterojunction-homojunction solar cell may comprise: a back-side electrical contact; a highly doped single crystal silicon layer doped with a dopant of a first polarity over the back-side electrical contact; a doped single crystal silicon absorber layer doped with a dopant of the first polarity over the highly doped single crystal silicon layer, the highly doped single crystal silicon layer having a higher resistivity than the doped single crystal silicon absorber layer; a layer of intrinsic wide band gap material with a band gap larger than single crystal silicon over the doped single crystal silicon absorber layer; a layer of doped wide band gap material with a dopant of a second polarity with a band gap larger than single crystal silicon over the layer of intrinsic wide band gap material, the second polarity being opposite to the first polarity; a transparent conducting oxide layer over the layer of doped wide band gap material; and front side electrical contacts on the transparent conducting oxide layer. The solar cell may further comprise a dielectric stack between the back-side electrical contact and the highly doped single crystal silicon layer, the dielectric stack including apertures, each of the apertures being filled by a metal point contact for making electrical contact between the back-side electrical contact and the highly doped single crystal silicon layer.

According to further aspects of the present invention, a method of manufacturing a silicon heterojunction-homojunction solar cell may comprise: providing a single crystal silicon substrate with a porous silicon separation layer on the surface thereof; epitaxially depositing a highly doped single crystal silicon layer doped with a dopant of a first polarity on the surface of the porous silicon separation layer; epitaxially depositing a doped single crystal silicon absorber layer doped with a dopant of the first polarity over the highly doped single crystal silicon layer, the highly doped single crystal silicon layer having a higher resistivity than the doped single crystal silicon absorber layer; depositing a layer of intrinsic wide band gap material with a band gap larger than single crystal silicon over the doped single crystal silicon absorber layer; depositing a layer of doped wide band gap material with a dopant of a second polarity with a band gap larger than single crystal silicon over the layer of intrinsic wide band gap material, the second polarity being opposite to the first polarity; depositing a transparent conducting oxide layer over the layer of doped wide band gap material; depositing front side electrical contacts on the transparent conducting oxide layer; after the depositing front side electrical contacts, bonding the stack formed on the single crystal silicon substrate to an optically transparent substrate using an encapsulant; separating the single crystal silicon substrate from the highly doped single crystal silicon layer at the porous silicon separation layer; and forming an electrical contact to the highly doped single crystal silicon layer. The method may further comprise, after the separating and before the forming: depositing a dielectric stack on the highly doped single crystal silicon layer; and forming apertures within the dielectric stack.

According to yet furthermore aspects of the present invention, a method of manufacturing a silicon double heterojunction solar cell may comprise: providing a single crystal silicon substrate with a porous silicon separation layer on the surface thereof; epitaxially depositing a doped single crystal silicon layer doped with a dopant of a first polarity on the surface of the porous silicon separation layer; depositing a layer of intrinsic wide band gap material with a band gap larger than single crystal silicon over the doped single crystal silicon absorber layer; depositing a layer of doped wide band gap material with a dopant of a second polarity with a band gap larger than single crystal silicon over the layer of intrinsic wide band gap material, the second polarity being opposite to the first polarity; depositing a transparent conducting oxide layer over the layer of doped wide band gap material; depositing front side electrical contacts on the transparent conducting oxide layer; after the depositing front side electrical contacts, bonding the stack formed on the single crystal silicon substrate to an optically transparent substrate using an encapsulant; separating the single crystal silicon substrate from the doped single crystal silicon absorber layer at the porous silicon separation layer; depositing a second layer of intrinsic wide band gap material with a band gap larger than single crystal silicon over the doped single crystal silicon absorber layer; depositing a second layer of doped wide band gap material with a dopant of a first polarity with a band gap larger than single crystal silicon over the second layer of intrinsic wide band gap material; depositing a second transparent conducting oxide layer over the second layer of doped wide band gap material; and depositing back-side electrical contacts on the second transparent conducting oxide layer.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention includes methods for fabricating HIT solar cells, including double heterojunction solar cells and hybrid heterojunction-homojunction solar cells, with very thin single crystal silicon wafers, where the silicon wafer may be less than 80 microns thick, and even less than 50 microns thick. The methods overcome potential issues with handling these very thin wafers by using a process including epitaxial silicon deposition on a growth substrate, partial cell fabrication, attachment to a support substrate and then separation from the growth substrate.

Furthermore, the present invention includes device structures based on the HIT solar cell which are expected to provide cost of manufacturing and performance advantages. For example, embodiments of the present invention may include a solar cell device architecture comprising the combination of a heterostructure on the front side of the device with a homojunction at the rear of the device. Furthermore, device performance may be enhanced by including a dielectric stack on the backside of the device for reflecting long wavelength infrared radiation.

Figure 1:
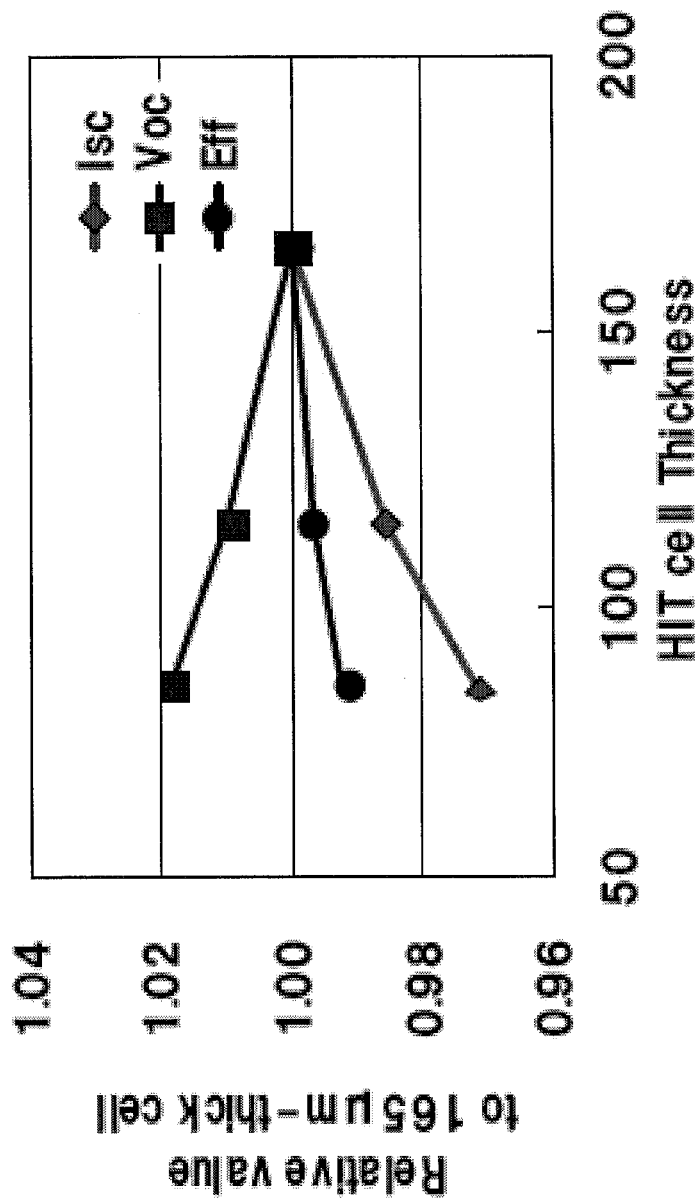
FIG. 1 shows plots of different measures of solar cell efficiency against cell thickness for a prior art HIT cell.
Figure 2:
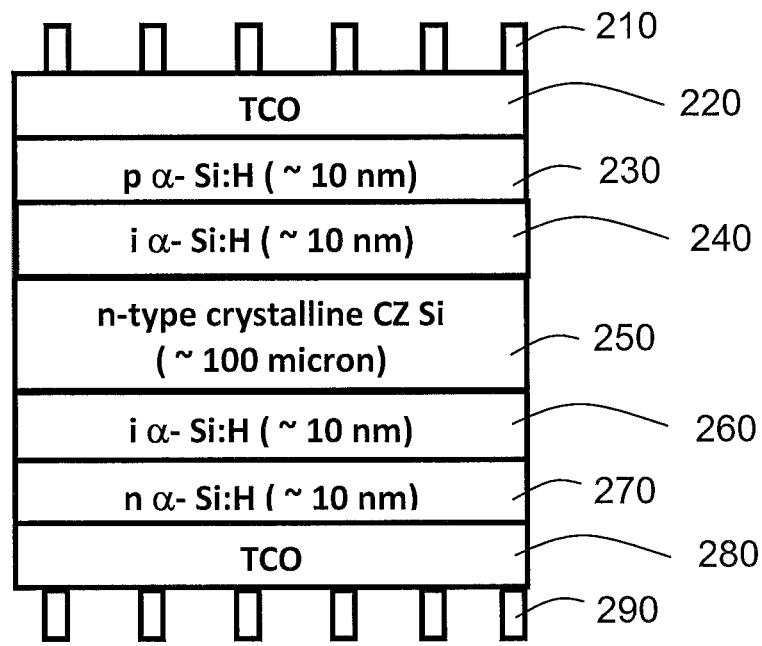
FIG. 2 shows a cross-sectional representation of a conventional prior art HIT solar cell device.
Figure 3:
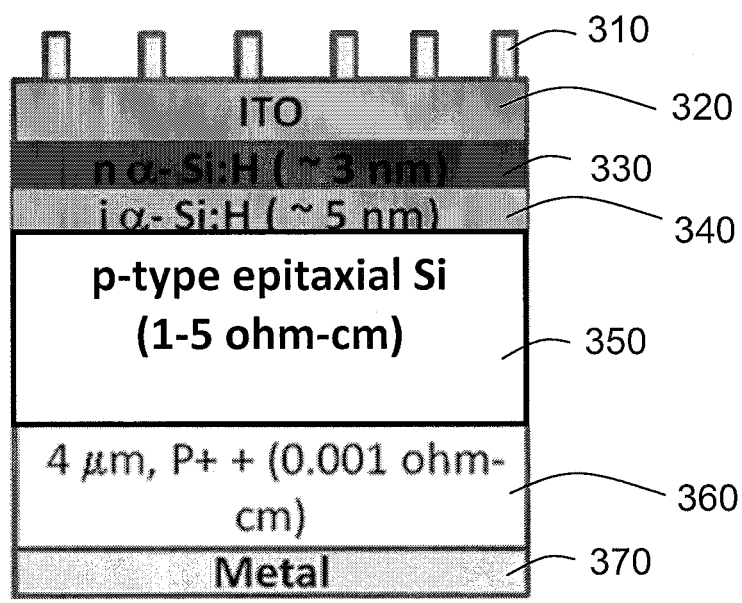
FIG. 3 shows a cross-sectional representation of a hybrid heterojunction-homojunction device, according to some embodiments of the present invention.

FIG. 2 shows a conventional prior art HIT device with a thinned CZ crystalline silicon base. The device comprises front side electrical contacts 210, a layer of transparent conducting oxide (TCO) 220, a layer of p-type amorphous silicon (p α-Si:H) 230 approximately 10 nm thick, a layer of intrinsic amorphous silicon (i α-Si:H) 240 approximately 10 nm thick, a layer of n-type crystalline Czochralski (CZ) silicon 250 approximately 100 microns thick, a layer of intrinsic amorphous silicon (i α-Si:H) 260 approximately 10 nm thick, a layer of n-type amorphous silicon (n α-Si:H) 270 approximately 10 nm thick, a layer of transparent conducting oxide (TCO) 280, and back side electrical contacts 290. According to some embodiments of the present invention, the HIT device of FIG. 2 may be improved by replacing the layers on the backside by a $p^{++}$ layer, thus forming a homojunction on the backside, such as shown in FIG. 3. The device of FIG. 3 is referred to herein as a hybrid heterojunction-homojunction device and comprises front side electrical contacts 310, a layer of indium tin oxide (ITO) 320, a layer of n-type amorphous silicon (n α-Si:H) 330 approximately 3 nm thick, a layer of intrinsic amorphous silicon (i α-Si:H) 340 approximately 5 nm thick, a layer of p-type epitaxially grown single crystal silicon 350 with a resistivity of approximately 1 to 5 ohm-cm, a layer of highly doped, $p^{++}$, epitaxially-grown single crystal silicon 360 with a resistivity of less than $10^{-2}$ ohm-cm and thickness of less than 5 microns, and a metal back side electrical contact 370.

Figure 4:
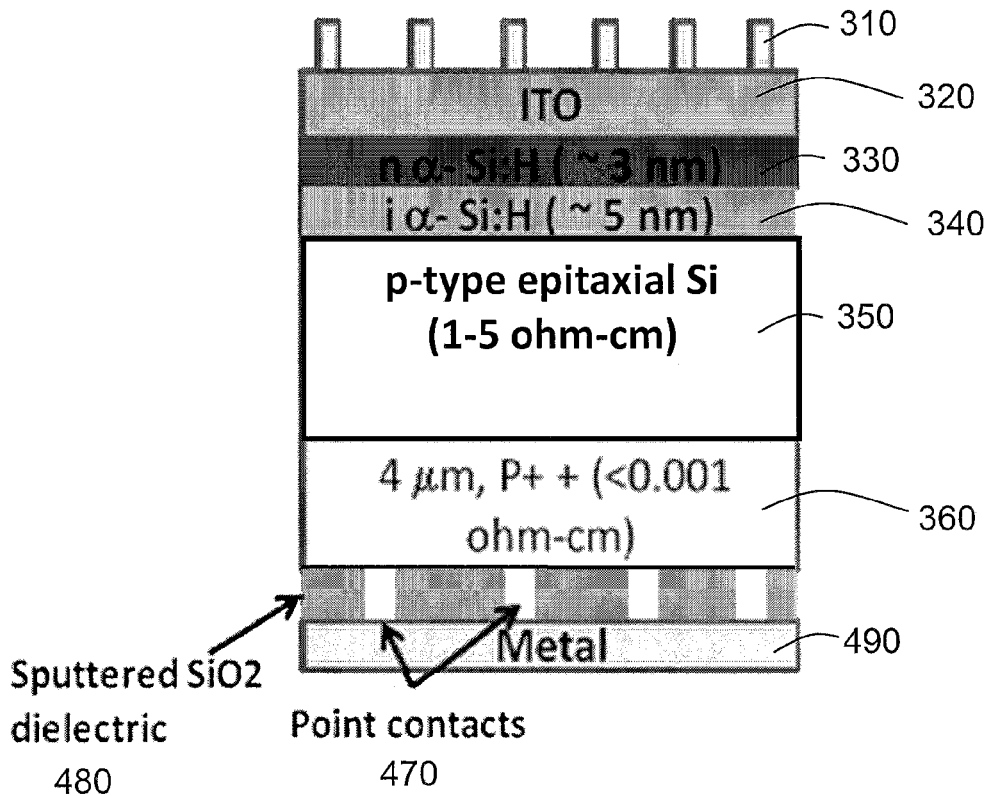
FIG. 4 shows a cross-sectional representation of a hybrid heterojunction-homojunction device with a dielectric stack and point contacts on the backside, according to some embodiments of the present invention.

Further improvement may be achieved with the addition of a dielectric stack and point contacts on the backside of the hybrid heterojunction-homojunction device, such as shown in FIG. 4. The device of FIG. 4 comprises front side electrical contacts 310, a layer of indium tin oxide (ITO) 320, a layer of n-type amorphous silicon (n α-Si:H) 330 approximately 3 nm thick, a layer of intrinsic amorphous silicon (i α-Si:H) 340 approximately 5 nm thick, a layer of p-type epitaxially grown single crystal silicon 350 with a resistivity of approximately 1 to 5 ohm-cm, a layer of highly doped, $p^{++}$, epitaxially-grown single crystal silicon 360 with a resistivity of less than $10^{-2}$ ohm-cm and thickness less than 5 microns, metal point contacts 470 (not shown), a sputtered silicon dioxide dielectric 480, and a metal back side electrical contact 490.

According to aspects of the present invention, a silicon heterojunction-homojunction solar cell may comprise: a back-side electrical contact; a highly doped single crystal silicon layer doped with a dopant of a first polarity over the back-side electrical contact; a doped single crystal silicon absorber layer doped with a dopant of the first polarity over the highly doped single crystal silicon layer, the highly doped single crystal silicon layer having a higher resistivity than the doped single crystal silicon absorber layer; a layer of intrinsic wide band gap material with a band gap larger than single crystal silicon over the doped single crystal silicon absorber layer; a layer of doped wide band gap material with a dopant of a second polarity with a band gap larger than single crystal silicon over the layer of intrinsic wide band gap material, the second polarity being opposite to the first polarity; a transparent conducting oxide layer over the layer of doped wide band gap material; and front side electrical contacts on the transparent conducting oxide layer. The solar cell may further comprise a dielectric stack between the back-side electrical contact and the highly doped single crystal silicon layer, the dielectric stack including apertures, each of the apertures being filled by a metal point contact for making electrical contact between the back-side electrical contact and the highly doped single crystal silicon layer.

The combination of the rear surface homojunction structure and a dielectric mirror with a front heterojunction in the present invention has the following advantages.

A first advantage is the rear dielectric stack (composed of a low refractive index dielectric and a metal layer) will reflect long wavelength (>900 nm) infrared radiation back into the silicon rather than allow it to be transmitted through the wafer. This can obviate the observed reduction of $I_{sc}$ (short circuit current density) with reducing silicon thickness in conventional HIT devices and may potentially lead to higher efficiencies.

A second advantage is the $p^+$-p rear junction, which may be formed epitaxially as a "built-in" junction as described below, shields electrons from the rear surface. Consequently, there is less need for rear surface passivation, unlike a symmetrical HIT device.

A third advantage is the hybrid structure is also likely to be less expensive to manufacture as there is no need for α-Si (amorphous silicon) and ITO deposition on the back side since the built-in $p^+$-p junction, which may be formed by epitaxial deposition as described below, shields electrons from the rear surface and the rear dielectric stack fabrication is an inexpensive step involving PVD of a dielectric film, such as $SiO_2$ and an aluminum layer, interspersed by a laser ablation step to create vias in the dielectric for ohmic contacts. In particular, the feasibility of eliminating one ITO deposition step is important from a cost and performance point of view. (Aluminum is also a better conductor than ITO.)

A fourth advantage, in the case of epitaxial deposition of the wafers, is the ability to epitaxially fabricate wafers of any thickness to enable taking maximum advantage of the observed phenomenon of increasing open circuit voltage with decreasing wafer thickness, without sacrificing device current. Furthermore, as discussed in detail in U.S. patent application Ser. No. 13/483,002 to V. Sivaramakrishnan et al., incorporated by reference in its entirety herein, epitaxial deposition of thin silicon wafers may also provide a cost advantage.

In addition, other heterojunction, wide band gap materials may be used in place of amorphous silicon, such as SiC, BN, BC, etc., in the structure of FIG. 3. These materials have wider bandgaps which may enable higher open circuit voltages.

FIGS. 5-8 illustrate an example of a process flow for fabrication of the hybrid heterojunction-homojunction devices, according to some embodiments of the present invention.

Figure 5:
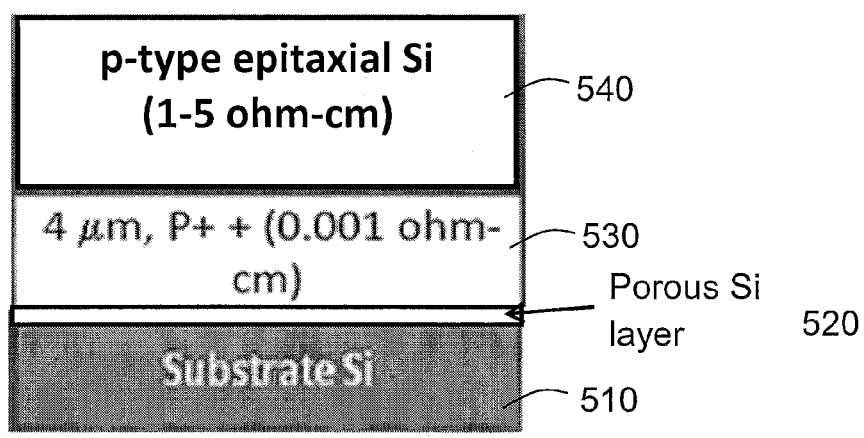
FIGS. 5-8 show cross-sectional representations of a hybrid heterojunction-homojunction device fabrication sequence, according to some embodiments of the present invention.

FIG. 5 is a cross-sectional representation of a single crystal silicon substrate 510 on which a porous silicon layer 520, roughly 1 to 2 microns thick has been formed on the top surface by anodic etching. The porous silicon layer is formed to provide both: (1) a template for epitaxial deposition of single crystal silicon and (2) an effective separation layer for separating the epitaxially deposited layer from the silicon substrate at a later stage in the process. On top of the porous silicon layer epitaxial single crystal silicon layers are formed—a first layer 530 of $p^{++}$ (less than 0.01 Ohm-cm) material less than 5 microns thick followed by a second layer 540, 50 microns thick or less, of p-type (1-5 Ohm-cm) material; although, epitaxial fabrication of thin wafer layers 80 microns thick or less, and even layers greater than 80 microns thick may also be fabricated. Further details of fabrication methods for the separation layer and epitaxial layer are provided in published U.S. patent applications nos. 2010/0108134 to K. V. Ravi, 2010/0108130 to K. V. Ravi, 2009/0227063 to T. S. Ravi et al., 2011/0056532 to T. S. Ravi et al. and 2012/0040487 to A. Asthana et al., all incorporated by reference in their entirety herein.

Figure 6:
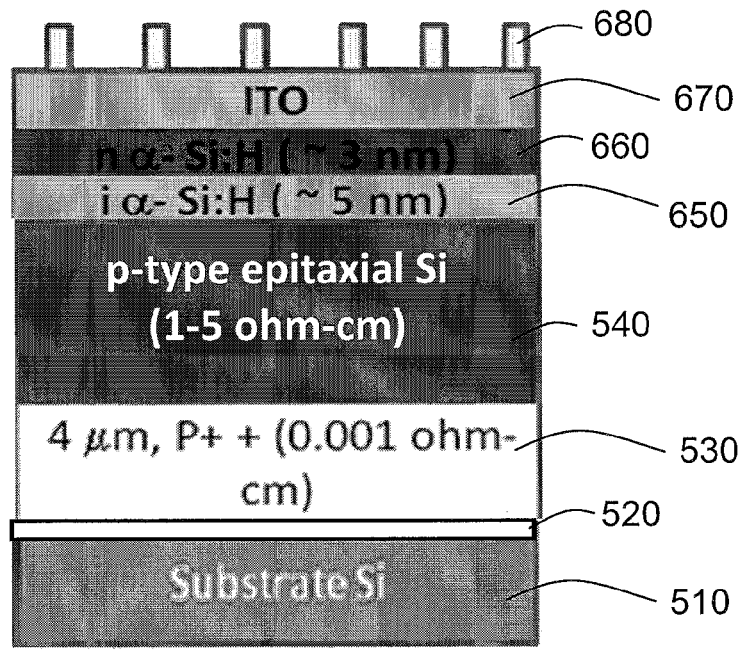

FIG. 6 shows the deposition of intrinsic and doped amorphous silicon layers 650 and 660 roughly 5 and 3 nm thick, respectively, and an ITO layer 670, and finally screen printing of metal contacts 680. (In this particular example the doped amorphous silicon layer is doped n-type.) Furthermore, the epitaxial layer may be texture etched by well known processes, using solutions containing potassium hydroxide (KOH) and isopropyl alcohol (IPA)—note that for ease of illustration the texture of the surface is not shown in the figures. The amorphous silicon layers may be deposited using various techniques well known in the art, including PECVD (plasma enhanced chemical vapor deposition) and Hot Wire CVD. The TCO (ITO) layer may be deposited using various techniques well known in the art, including PVD (physical vapor deposition). Metallization of the front surface to form contacts may be by well known processes such as printing of conducting polymer pastes, followed by curing at temperatures low enough to avoid crystallization of the amorphous silicon layer—perhaps below 400° C.

Figure 7:
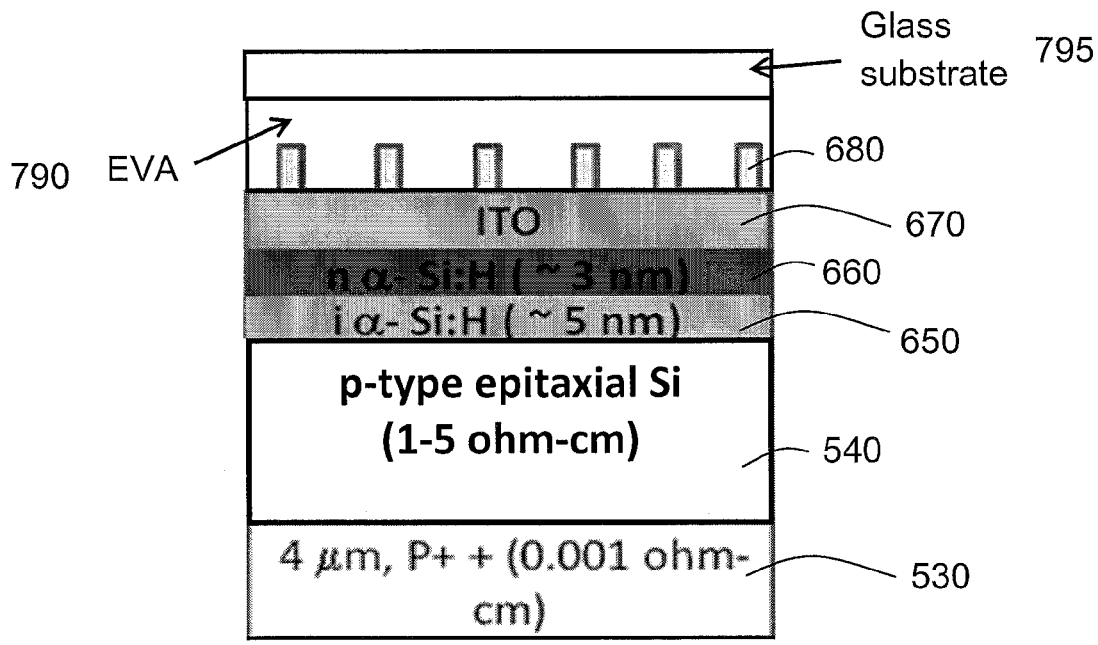

FIG. 7 shows the result of bonding the device to a glass/plastic substrate 795 using an encapsulant 790, such as ethylene vinyl acetate (EVA) or silicones, followed by releasing the laminated device from the silicon substrate 510 at the porous silicon layer 520. The silicon substrate may be edge released and the solar cell exfoliated, using techniques described in published U.S. patent applications nos. 2010/

0108134 to K. V. Ravi, 2010/0108130 to K. V. Ravi, 2009/0227063 to T. S. Ravi et al., and 2011/0056532 to T. S. Ravi et al., all incorporated by reference in their entirety herein. After release, the back side of the cell may be etched to remove any remnants of the porous silicon layer. Note that cell interconnect ribbons (not shown in the figures) are attached to the metal contacts on the cell prior to lamination. See U.S. application Ser. No. 13/566,960 to K. V. Ravi et al., incorporated by reference herein, for more details of lamination and interconnection.

Figure 8:
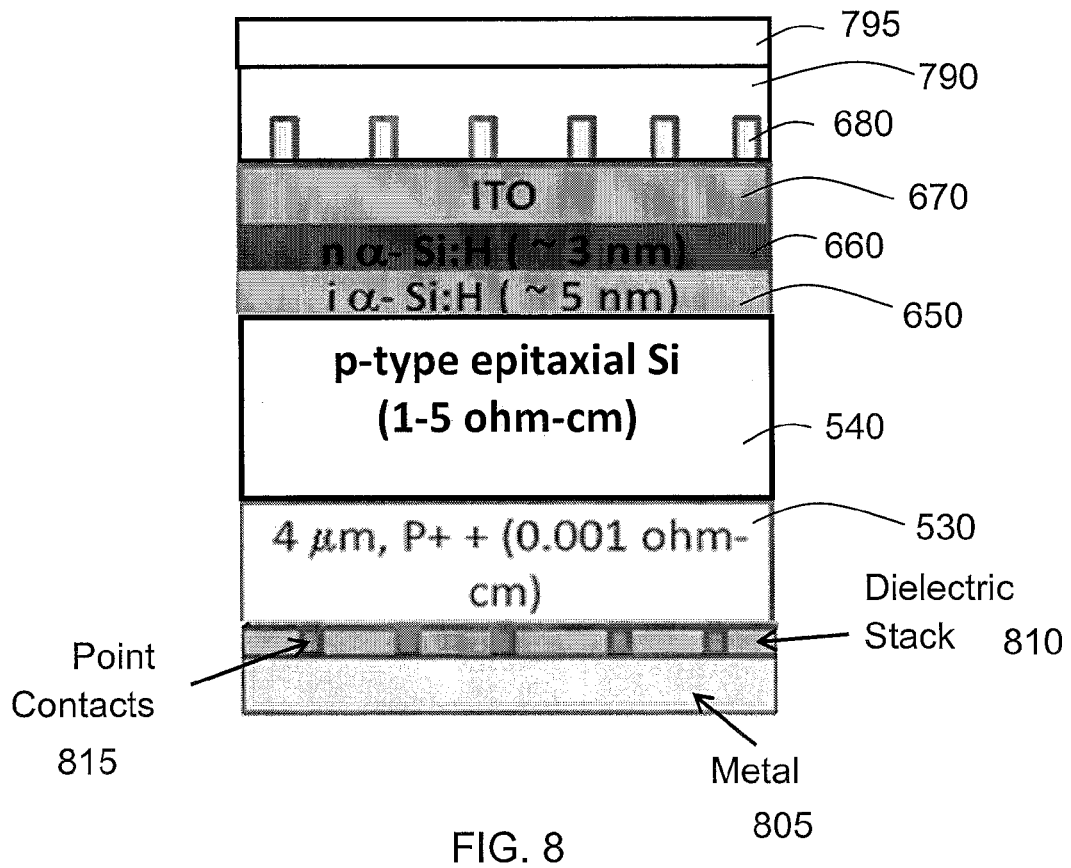

FIG. 8 shows the result of depositing dielectric layers to form a dielectric stack 810, forming apertures in the dielectric layers, by a process such as laser ablation, and depositing aluminum metal in the apertures and over the back surface to create ohmic point contacts 815 and a blanket metal back contact 805. Further details of the formation of dielectric stack and backside point contacts are found in U.S. patent application Ser. No. 13/241,112 to K. V. Ravi et al., incorporated in its entirety by reference herein. In brief, several methods of material deposition may be used for the dielectric layers and metal, with the proviso that the methods are low temperature methods since the thin solar cell is bonded to glass using an adhesive or encapsulation material such as EVA (ethylene vinyl acetate) or silicones of various types. These materials cannot be heated to temperatures in excess of approx. 100° C. (for EVA) and approx. 250° C. (for silicones) in the course of depositing materials on the back surface of the solar cells. Candidates for the dielectric material are provided in Table 1, below. Methods that can be used for dielectric deposition include: (1) physical vapor deposition including sputtering and e-beam evaporation; (2) low temperature chemical vapor deposition (CVD) including plasma enhanced CVD; (3) hot wire CVD which is particularly well suited for the deposition of silicon nitride films and amorphous silicon films; and (4) spin on techniques whereby the dielectric material is made into a liquid which can be spun on or sprayed on to the silicon. Other techniques such as atomic layer deposition and ion beam deposition are also possible candidates. Patterning of apertures in the dielectric may include: (1) lithography and etching; (2) screen printing etching pastes; and (3) laser ablation. The holes are typically 100 microns in diameter and are spaced roughly 1 mm apart.

Regarding the deposition of metal to form the backside contact structure of FIG. 8, a blanket layer of Al (Ni, V) alloy may be sputtered over the patterned dielectric so as to form electrical point contacts 815 to the exposed $p^{++}$ layer 530. The metal film may also be evaporated. Following deposition of the metal film, a low temperature (less than 250° C.) anneal is performed, so as to form an ohmic contact between the metal and the $p^{++}$ layer.

Table 1 provides a list of some dielectric materials that may be used as a dielectric layer in the dielectric stack on the back side of the solar cell structure. For reference it is noted that the refractive indices (RI) of air and silicon are 1 and 3.5, respectively.

TABLE 1

Candidate dielectric materials for back side dielectric stack.

| Material | RI | Comments |
| --- | --- | --- |
| $SiO_2$ | 1.54 | Low temperature deposition by sputtering or by e-beam evaporation may be used. |
| $Si_3N_4$ | 1.99 | Low temperature deposition by PECVD or hot wire CVD may be used. |
| Amorphous Si | approx. 4 | RI values can be below 2, for example with increased hydrogen content of the films. Low temperature deposition by HWCVD may be used. |
| $Al_2O_3$ | 1.76 | Low temperature deposition by atomic layer deposition (ALD) may be used. |
| SiC | 2.6 | Low temperature deposition by PECVD or ALD may be used. |
| AlN | 2.13 1.8-1.9 | Low temperature deposition by reactive sputtering may be used. |
| AlON | 1.78 | Low temperature deposition by sputtering techniques may be used. |

Furthermore, dielectric stacks with multiple layers can be formed to provide improved reflection of IR. For example, the following multiple layers of dielectric can be effective: (1) combinations of amorphous Si and $SiO_2$; and (2) layers of continually decreasing dielectric constant, viz. AlN followed by $SiO_2$.

According to further aspects of the present invention, a method of manufacturing a silicon heterojunction-homojunction solar cell may comprise: providing a single crystal silicon substrate with a porous silicon separation layer on the surface thereof; epitaxially depositing a highly doped single crystal silicon layer doped with a dopant of a first polarity on the surface of the porous silicon separation layer; epitaxially depositing a doped single crystal silicon absorber layer doped with a dopant of the first polarity over the highly doped single crystal silicon layer, the highly doped single crystal silicon layer having a higher resistivity than the doped single crystal silicon absorber layer; depositing a layer of intrinsic wide band gap material with a band gap larger than single crystal silicon over the doped single crystal silicon absorber layer; depositing a layer of doped wide band gap material with a dopant of a second polarity with a band gap larger than single crystal silicon over the layer of intrinsic wide band gap material, the second polarity being opposite to the first polarity; depositing a transparent conducting oxide layer over the layer of doped wide band gap material; depositing front side electrical contacts on the transparent conducting oxide layer; after the depositing front side electrical contacts, bonding the stack formed on the single crystal silicon substrate to an optically transparent substrate using an encapsulant; separating the single crystal silicon substrate from the highly doped single crystal silicon layer at the porous silicon separation layer; and forming an electrical contact to the highly doped single crystal silicon layer. The method may further comprise, after the separating and before the forming: depositing a dielectric stack on the highly doped single crystal silicon layer; and forming apertures within the dielectric stack.

Figure 9:
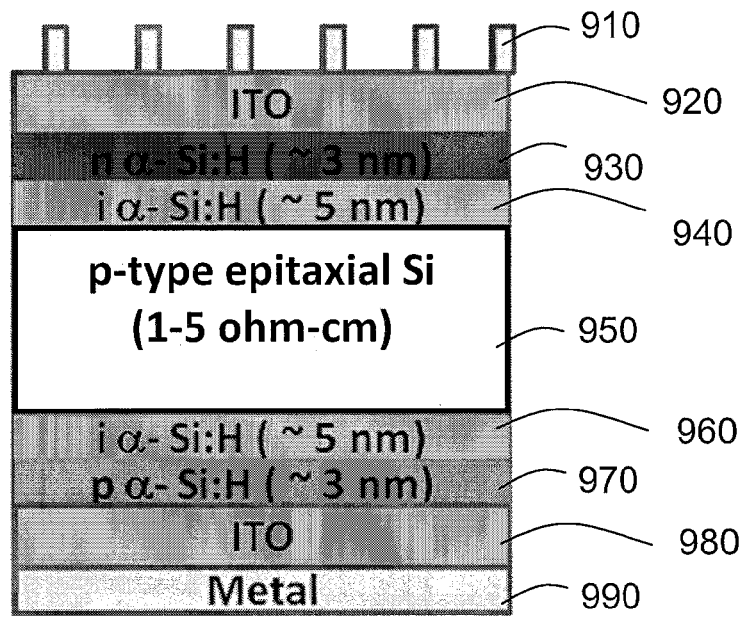
FIG. 9 shows a cross-sectional representation of a HIT solar cell device with thin epitaxial silicon, according to some embodiments of the present invention.

FIG. 9 shows a HIT cell similar to that of FIG. 2 with the CZ crystalline silicon (c-Si) wafer base replaced with an epitaxially deposited single crystal silicon base layer. The device comprises front side electrical contacts 910, a layer of transparent conducting oxide 920 such as (ITO), a layer of n-type amorphous silicon (n α-Si:H) 930 approximately 3 nm thick, a layer of intrinsic amorphous silicon (i α-Si:H) 940 approximately 5 nm thick, a layer of p-type epitaxial single crystal silicon 950 with approximately 1-5 Ohm-cm resistivity and thickness as described below, a layer of intrinsic amorphous silicon (i α-Si:H) 960 approximately 5 nm thick, a layer of p-type amorphous silicon (p α-Si:H) 970 approximately 3 nm thick, a layer of transparent conducting oxide 980 such as ITO, and a back side metal electrical contact 990. Epitaxial deposition of the base layer may provide manufacturing cost advantages over thinned silicon wafers, as described in detail in U.S. patent application Ser. No. 13/483, 002 to V. Sivaramakrishnan et al., incorporated by reference in its entirety herein.

Figure 10:
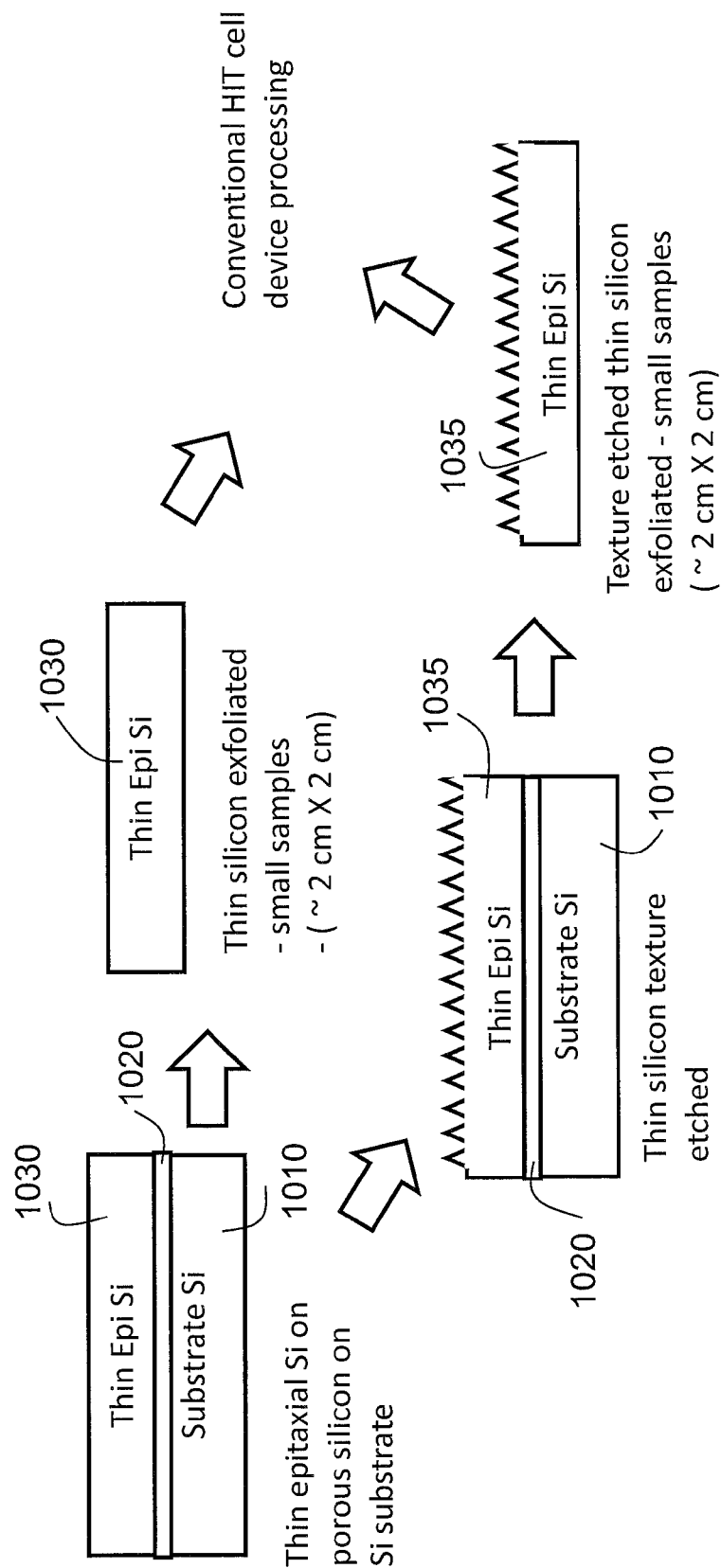
FIG. 10 illustrates process flows for fabricating HIT solar cells, according to embodiments of the present invention.

FIG. 10 illustrates some examples of process flows for fabricating the device of FIG. 9, where an epitaxial deposition process is utilized to form the single crystal silicon base layer. The process flow starts with a single crystal silicon substrate 1010 on which a porous silicon layer 1020, roughly 1 to 2 microns thick, has been formed on the top surface by anodic etching. On top of the porous silicon layer an epitaxial single crystal silicon base layer 1030 is formed—a layer of p-type (1-5 Ohm-cm) material; the epitaxial layer may be 80 microns or more thick, less than 80 microns thick, or even less than 50 microns thick. Further details of fabrication methods for the separation layer and epitaxial layer are provided in published U.S. patent applications nos. 2010/0108134 to K. V. Ravi, 2010/0108130 to K. V. Ravi, 2009/0227063 to T. S. Ravi et al., 2011/0056532 to T. S. Ravi et al. and 2012/0040487 to A. Asthana et al., all incorporated by reference in their entirety herein. A divergence in the process flow shows the option of texture etching the surface of the silicon layer (forming texture etched epitaxial layer 1035) prior to exfoliation from the silicon substrate to form the thin silicon wafers. The wafers may be fabricated in a wide range of sizes, but are typically small area—2 cm×2 cm—for the thinner (less than 80 micron) wafers. This is done by either dicing or laser scribing prior to exfoliation. The wafers are then used as the starting point for standard HIT cell fabrication. For example, see Taguchi et al. (2009) and references contained therein.

However, the process flows of FIG. 10 present a handling challenge, when the thickness of the epitaxially deposited silicon layers gets below 100 microns, and more so as the silicon layer gets thinner, even below 50 microns in thickness. Handling of these thin epitaxially deposited silicon layers is accommodated by the process flow illustrated in FIG. 11.

Figure 11:
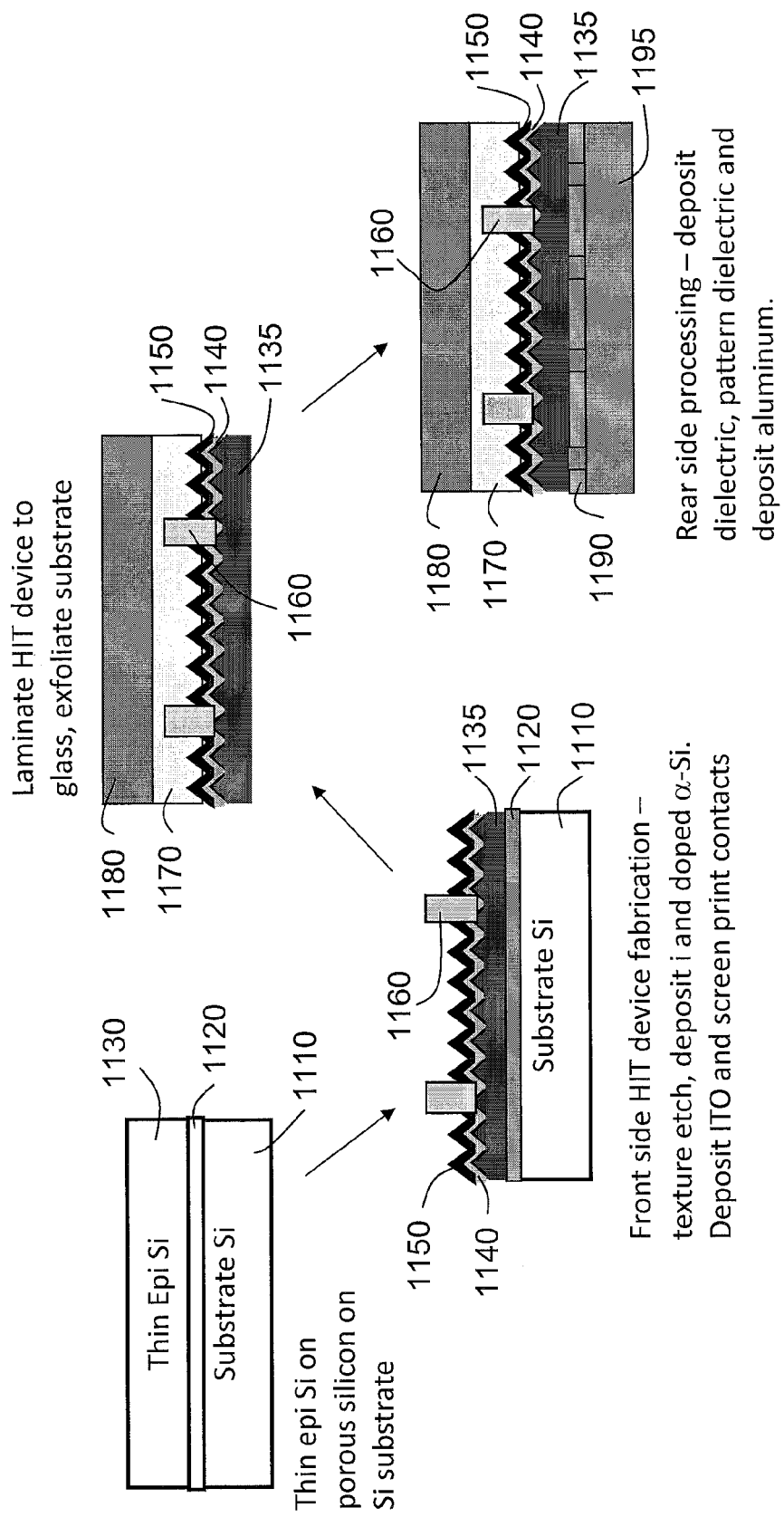
FIG. 11 illustrates a further process flow for fabricating HIT solar cells, according to embodiments of the present invention.

FIG. 11 is an illustration of an example of a process flow according to the present invention which provides a handling solution for the thin silicon wafers formed as described above by epitaxial deposition; this process flow allows much larger wafer areas to be processed without breakage. Wafer sizes are determined by the size of the silicon substrate used for epitaxial growth, and typically are 125 mm×125 mm, 156 mm×156 mm, or larger. The first step includes epitaxial deposition of the single crystal silicon base layer 1130 as described above. While the base layer 1130 is still attached to the single crystal silicon substrate 1110, front side HIT cell fabrication is completed—including texture etch of the silicon base layer (forming textured silicon layer 1135), deposition of intrinsic and doped amorphous silicon layers, 1140, deposition of ITO 1150 and screen printing of contacts 1160. After front side fabrication is complete the device is laminated to a substrate 1180 such as glass, or another suitable polymer material, using an encapsulant 1170, such as EVA, silicones, etc., as described above with reference to FIG. 7. After lamination, the device is exfoliated from the silicon substrate at the porous silicon layer 1120, again as described above. After exfoliation, rear side processing is completed as described above with reference to FIG. 8.

According to yet furthermore aspects of the present invention, a method of manufacturing a silicon double heterojunction solar cell may comprise: providing a single crystal silicon substrate with a porous silicon separation layer on the surface thereof; epitaxially depositing a doped single crystal silicon layer doped with a dopant of a first polarity on the surface of the porous silicon separation layer; depositing a layer of intrinsic wide band gap material with a band gap larger than single crystal silicon over the doped single crystal silicon absorber layer; depositing a layer of doped wide band gap material with a dopant of a second polarity with a band gap larger than single crystal silicon over the layer of intrinsic wide band gap material, the second polarity being opposite to the first polarity; depositing a transparent conducting oxide layer over the layer of doped wide band gap material; depositing front side electrical contacts on the transparent conducting oxide layer; after the depositing front side electrical contacts, bonding the stack formed on the single crystal silicon substrate to an optically transparent substrate using an encapsulant; separating the single crystal silicon substrate from the doped single crystal silicon absorber layer at the porous silicon separation layer; depositing a second layer of intrinsic wide band gap material with a band gap larger than single crystal silicon over the doped single crystal silicon absorber layer; depositing a second layer of doped wide band gap material with a dopant of a first polarity with a band gap larger than single crystal silicon over the second layer of intrinsic wide band gap material; depositing a second transparent conducting oxide layer over the second layer of doped wide band gap material; and depositing back-side electrical contacts on the second transparent conducting oxide layer.

Furthermore, the above processes may be modified to form bifacial devices according to the present invention. For a bifacial device, the rear side has a grid of aluminum, or other electric contact material, rather than the blanket layer described above.

Although the present invention has been described with reference to processes and devices including thin p-type epitaxial single crystal silicon wafers, the present invention also covers the same processes and devices including thin n-type epitaxial single crystal silicon wafers. For example, the processes of the present invention can be used to fabricate the prior art device of FIG. 2 with a thin (less than 50 micron thick) n-type epitaxial single crystal silicon wafer in place of the 100 micron thick CZ, n-type c-Si wafer. Furthermore, the device of FIG. 3 can be fabricated with, in place of p-type amorphous silicon, a p-type base layer and a $p^{++}$ layer on the back side of the cell, n-type amorphous silicon, an n-type base layer and an $n^{++}$ layer of the back side of the cell, respectively. Note that the dopant levels for the n-type and p-type equivalents are nominally the same.

With reference to FIG. 3, some embodiments of the present invention may further include a passivation layer (not shown) between the metal back-side electrical contact 370 and the highly doped single crystal silicon layer 360. The passivation layer may be a dielectric such as $SiO_2$ or $Al_2O_3$. Furthermore, it should be noted that a dielectric stack as shown in FIGS. 4 & 8 and described above will also act to passivate the surface of the highly doped single crystal silicon layer. For example, a dielectric stack may have a layer of $Al_2O_3$ on the surface of the highly doped single crystal silicon layer followed by a layer of $SiO_2$, where the $Al_2O_3$ layer passivates the surface of the highly doped single crystal silicon layer and the change in refractive index between the $Al_2O_3$ layer and the $SiO_2$ layer increases the reflectivity of the stack for longer wavelength light (IR).

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of manufacturing a silicon heterojunction-homojunction solar cell, comprising:
   providing a single crystal silicon substrate with a porous silicon separation layer on the surface thereof;
   epitaxially depositing a highly doped single crystal silicon layer doped with a dopant of a first polarity on the surface of the porous silicon separation layer;
   epitaxially depositing a doped single crystal silicon absorber layer doped with a dopant of said first polarity over said highly doped single crystal silicon layer, said highly doped single crystal silicon layer having a lower resistivity than said doped single crystal silicon absorber layer;
   depositing a layer of intrinsic wide band gap material with a band gap larger than single crystal silicon over said doped single crystal silicon absorber layer;
   depositing a layer of doped wide band gap material with a dopant of a second polarity with a band gap larger than single crystal silicon over said layer of intrinsic wide band gap material, said second polarity being opposite to said first polarity;
   depositing a transparent conducting oxide layer over said layer of doped wide band gap material;
   depositing front side electrical contacts on said transparent conducting oxide layer;
   after said depositing front side electrical contacts, bonding the stack formed on said single crystal silicon substrate to an optically transparent substrate using an encapsulant;
   separating said single crystal silicon substrate from said highly doped single crystal silicon layer at the porous silicon separation layer; and
   forming an electrical contact to said highly doped single crystal silicon layer.

2. The method of claim 1, further comprising, after said separating and before said forming:
   depositing a dielectric stack on said highly doped single crystal silicon layer; and
   forming apertures within said dielectric stack.

3. The method of claim 1, wherein the wide band gap material is amorphous silicon.

4. The method of claim 1, wherein said highly doped single crystal silicon layer has a resistivity of less than $10^{-2}$ Ohm-cm.

5. The method of claim 1, wherein said doped single crystal silicon absorber layer has a resistivity in the range of 1 to 5 Ohm-cm.

6. The method of claim 1, wherein said doped single crystal silicon absorber layer has a thickness of less than 50 microns.

7. The method of claim 1, wherein said doped single crystal silicon absorber layer has a thickness of less than 80 microns.

8. The method of claim 1, further comprising, after said separating and before said forming, depositing a dielectric passivation layer on said highly doped single crystal silicon layer.

9. The method of claim 1, wherein said highly doped single crystal silicon layer has a thickness of less than 5 microns.

10. The method of claim 1, wherein said dopant of a first polarity is an n-type dopant and said dopant of a second polarity is a p-type dopant.

11. The method of claim 1, wherein the wide band gap material is silicon carbide.

12. A method of manufacturing a silicon double heterojunction solar cell comprising:
   providing a single crystal silicon substrate with a porous silicon separation layer on the surface thereof;
   epitaxially depositing a doped single crystal silicon layer doped with a dopant of a first polarity on the surface of the porous silicon separation layer;
   depositing a layer of intrinsic wide band gap material with a band gap larger than single crystal silicon over said doped single crystal silicon absorber layer;
   depositing a layer of doped wide band gap material with a dopant of a second polarity with a band gap larger than single crystal silicon over said layer of intrinsic wide band gap material, said second polarity being opposite to said first polarity;
   depositing a transparent conducting oxide layer over said layer of doped wide band gap material;
   depositing front side electrical contacts on said transparent conducting oxide layer;
   after said depositing front side electrical contacts, bonding the stack formed on said single crystal silicon substrate to an optically transparent substrate using an encapsulant;
   separating said single crystal silicon substrate from said doped single crystal silicon absorber layer at the porous silicon separation layer;
   depositing a second layer of intrinsic wide band gap material with a band gap larger than single crystal silicon over said doped single crystal silicon absorber layer;
   depositing a second layer of doped wide band gap material with a dopant of a first polarity with a band gap larger than single crystal silicon over said second layer of intrinsic wide band gap material;
   depositing a second transparent conducting oxide layer over said second layer of doped wide band gap material; and
   depositing back-side electrical contacts on said second transparent conducting oxide layer.

13. The method of claim 12, wherein said doped single crystal silicon absorber layer has a resistivity in the range of 1 to 5 Ohm-cm.

14. The method of claim 12, wherein said doped single crystal silicon absorber layer has a thickness of less than 50 microns.

15. The method of claim 12, wherein said doped single crystal silicon absorber layer has a thickness of less than 80 microns.

16. The method of claim 12, wherein said dopant of a first polarity is an n-type dopant and said dopant of a second polarity is a p-type dopant.

17. The method of claim 12, wherein the wide band gap material is amorphous silicon.

18. The method of claim 12, wherein the wide band gap material is silicon carbide.

* * * * *